(12) United States Patent
Hargrove et al.

(10) Patent No.: US 7,315,438 B2
(45) Date of Patent: Jan. 1, 2008

(54) TECHNIQUE TO REDUCE ESD LOADING CAPACITANCE

(75) Inventors: Michael Hargrove, Clinton Corners, NY (US); Joseph Petrosky, LaGrangeville, NY (US)

(73) Assignee: Seiko Epson Corporation, Tokyo (JP)

( * ) Notice: Subject to any disclaimer, the term of this patent is extended or adjusted under 35 U.S.C. 154(b) by 644 days.

(21) Appl. No.: 10/458,553

(22) Filed: Jun. 10, 2003

(65) Prior Publication Data

US 2004/0252426 A1 Dec. 16, 2004

(51) Int. Cl.
*H02H 9/00* (2006.01)
(52) U.S. Cl. ....................................... 361/56
(58) Field of Classification Search .............. 361/56, 361/111
See application file for complete search history.

(56) References Cited

U.S. PATENT DOCUMENTS

| | | | | |
|---|---|---|---|---|
| 5,166,858 A * | 11/1992 | Frake et al. | ................ | 361/313 |
| 5,204,586 A * | 4/1993 | Moore | ........................ | 315/159 |
| 5,717,581 A * | 2/1998 | Canclini | ..................... | 363/60 |
| 5,818,288 A * | 10/1998 | Le et al. | ..................... | 327/536 |
| 5,877,650 A * | 3/1999 | Matsushita | .................. | 327/536 |
| 5,973,514 A * | 10/1999 | Kuo et al. | .................... | 326/98 |
| 5,973,897 A | 10/1999 | Opris et al. | .................... | 361/56 |
| 6,011,420 A * | 1/2000 | Watt et al. | ................... | 327/310 |
| 6,034,552 A * | 3/2000 | Chang et al. | ................. | 326/83 |
| 6,114,731 A | 9/2000 | London | ..................... | 257/355 |
| 6,204,721 B1* | 3/2001 | Yuen et al. | ................. | 327/534 |
| 6,448,123 B1 | 9/2002 | Lee et al. | .................... | 438/200 |
| 6,538,494 B2* | 3/2003 | Zimlich | ...................... | 327/537 |
| 6,924,963 B2* | 8/2005 | Young et al. | ............... | 361/111 |
| 2002/0085328 A1* | 7/2002 | Liu et al. | ..................... | 361/56 |
| 2002/0145892 A1* | 10/2002 | Shor et al. | .................... | 363/59 |

* cited by examiner

*Primary Examiner*—Michael Sherry
*Assistant Examiner*—Scott Bauer
(74) *Attorney, Agent, or Firm*—Rosalio Haro

(57) ABSTRACT

The capacitive loading effects of an ESD circuit having an electrostatic-protection diode are reduced by using a capacitance compensation circuit. Under normal operation when no electrostatic discharge is experienced, the capacitance reduction circuit maintains a reverse bias across the electrostatic-protection diode, which causes the diode's capacitance to be reduced below a predetermined value. When an electrostatic discharged is experienced, the capacitance compensation circuit removes the applied reverse bias, and shunts the electrostatic-protection diode to a power rail.

48 Claims, 16 Drawing Sheets

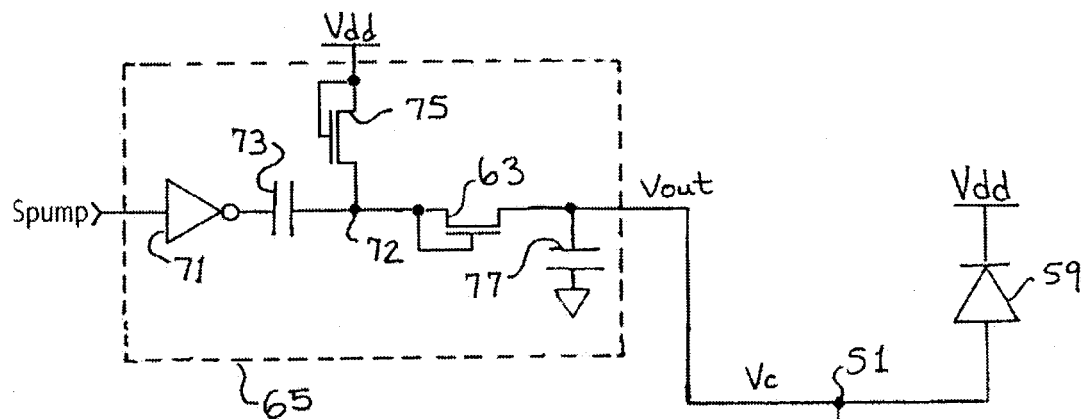
Fig. 13
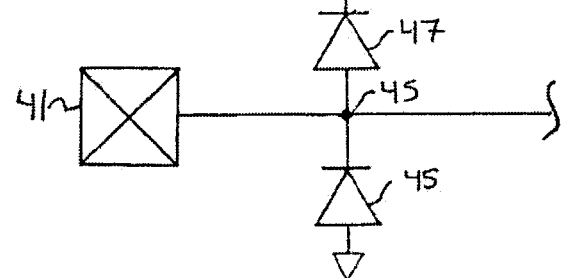
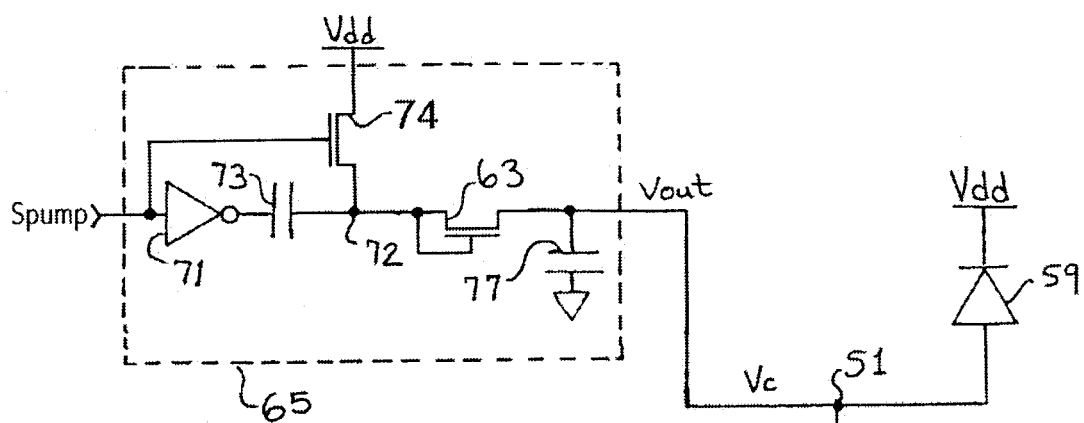
Fig. 14
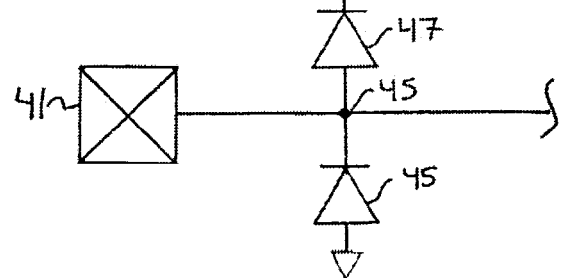

TECHNIQUE TO REDUCE ESD LOADING CAPACITANCE

BACKGROUND OF THE INVENTION

1. Field of the Invention

The present invention relates generally to the field of electrostatic discharge (ESD) protection for high frequency applications.

2. Description of the Related Art

The input impedance of a MOSFET, and some other devices, is capacitive making it inclined to build electrostatic charges. Thus, even a small amount of static charge placed on a bonding pad connected to a gate, from something or someone external to the MOSFET chip, can accumulate on the input capacitive impedance and build up to become a large enough electric field to cause the gate oxide of the MOSFET to break down.

An electrostatic discharge (ESD) circuit, or device, is typically applied to input, output, and input/output pads of a semiconductor integrated circuit (IC), or other sensitive device, to protect internal circuitry from electrostatic discharge, both in the manufacturing process and post-manufacturing handling.

With reference to FIG. 1, a basic ESD circuit 11 for an input signal includes a pair of clamping 13 and 15 coupled between an input pad 17 and internal circuitry 19. The purpose of diodes 13 and 15 is to prevent accumulated charge, or an incoming signal, from rising above the positive supply voltage Vdd or falling below the ground voltage by more than one forward diode voltage drop. Diode 13 provides primary protection against positive transients, and diode 15 provides primary protection against negative surges.

Many variations on the basic ESD circuit 11 are known. Sometimes, an optional current-limiting resistor is added between input pad 17 and ESD circuit 11, and diode 15 is sometimes left out of an ESD circuit when used on an output pad. However, the use of an electrostatic-protection diode, such as diode 13 and/or 15, is typically a part of most ESD structures.

The diode of an ESD circuit structure can be relatively large due to its need to withstand very high voltages. Therefore, an ESD circuit adds substantially to the loading capacitance on a pad, and this has a detrimental effect on high frequency input/output signals. Although at low frequency this capacitive loading, which may be as much as 5 pF, has negligible effect on input/output signal integrity, as the operating frequency increases to 1 GHz and beyond, ESD capacitive loading becomes a non-negligible contributor to signal degradation. A simple solution might be to reduce the diffusion area of an ESD circuit structure, and thereby lower its capacitance. However, this approach tends to degrade the ESD protection level, which typically needs to be greater than 2000 V.

Further complicating the use of ESD protection circuits in high frequency applications is that it has been shown that the junction capacitance of a diode is related to the voltage applied across the diode. Thus, the capacitive loading of an ESD circuit will fluctuate as the voltage at the input pad fluctuates, such as from the application of a logic signal transition.

With reference to FIG. 2, a first approach toward reducing the ill-effects of capacitive loading from an ESD circuit attempts to reduce the varying capacitance resulting from voltage fluctuations at input pad 17. In the present example, a first isolating diode 21 is inserted between input pad 17 and clamping diode 13, and a second isolating diode 23 is inserted between input pad 17 and clamping diode 15.

As stated earlier, a diode's capacitive value varies with the voltage applied across it. Thus, the present example attempts to stabilize the capacitive load seen on input pad 17 by reducing the amount of voltage fluctuations experience across the isolating diodes 21 and 23. That is, by minimizing voltage fluctuations on $V_{D1}$, the voltage across first isolating diode 21, fluctuations in the capacitance of diode 21 may be reduced. Similarly by minimizing fluctuations in $V_{D2}$, the voltage across second isolating diode 23, the fluctuations in the capacitance of diode 23 are also reduced.

To achieve this, a first differential amplifier 25, transfers the voltage applied to the anode of diode 21 to the cathode of diode 21. In this way, the voltage across diode 21 remains relatively constant irrespective of voltage fluctuations at input pad 17, and thus the capacitance due to diode 21 is likewise maintained relatively constant. In the same manner, a second differential amplifier 27 transfers the voltage applied to the cathode of diode 23 to the anode of diode 23. Since clamping diodes 13 and 15 are separated from input pad 17 by isolating diodes 21 and 23, respectively, the effects of capacitive loading on input pad 17 due to diodes 13 and 15 are reduced.

The use of differential amplifiers, however, limits its use in high frequencies applications. Additionally, differential amplifiers 25 and 27 contribute to the overall circuit complexity and capacitive loading of the ESD protection circuit. This approach, furthermore, does not address the issue of reducing the capacitance of clamping diodes 13 and 15.

OBJECTS OF THE INVENTION

The present invention is directed to solving these problems.

An object of the present invention is to reduce ESD capacitance while maintaining necessary ESD protection levels.

A second object of the present invention is to provide an ESD structure of reduced capacitance and suitable for high frequency applications, but that still provides robust ESD protection.

SUMMARY OF THE INVENTION

To achieve these objects, a capacitive reduction circuit is placed between an electrostatic-protection diode and a power rail. One end of the electrostatic-protection diode is coupled to an input signal and its other end is coupled to the capacitive reduction circuit at a junction node. The capacitive reduction circuit applies a compensation voltage to this junction node whose value is selected to assure that a reverse bias is maintained across the electrostatic-protection diode during normal (i.e. non-ESD) operation. By maintaining a reverse bias across the electrostatic-protection diode, its capacitive loading effect can be maintained to a predefined maximum. To assure that a reverse bias is maintained, the compensation voltage is made to be of greater magnitude than the power rail.

ESD protection continues to be provided by adapting the capacitive reduction circuit to respond to a potential at the signal node reaching a predefined value, by decoupling its output compensation voltage from the junction node, and instead coupling the junction node to the power rail. In this situation, the junction node is preferably coupled to the power rail through a shunting diode.

In one embodiment, the capacitive reduction circuit includes a voltage generator for providing the compensation voltage at the junction node. Preferably, the output from the voltage generator is applied to the junction node through a current steering diode, which mitigates the flow of current from the junction node to the voltage generator.

In an alternate embodiment, the voltage generator is implemented as a voltage pump, and in the preferred embodiment, the current steering diode is an integral part of the voltage pumping action of the voltage pump.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 13 shows an MOS implementation of the voltage pump of FIG. 12.

FIG. 14 is an alternate MOS implementation of the circuit of FIG. 13.

DESCRIPTION OF THE PREFERRED EMBODIMENTS

Preferred embodiments of the present invention are described below with reference to the accompanying figures.

The present invention is described in connection with various preferred embodiments thereof with reference to the accompanying drawings. However, various changes and modifications will be apparent to those skilled in the art based on the foregoing description. Such changes and modifications are intended to be included within the scope of the present invention to the extent they fall within the scope of the appended claims.

It has been shown that the capacitance across a diode can be affected by an applied reverse bias potential. The relationship between a diode's capacitance and an applied reverse bias potential may be expressed as, $$C_j(V_j)=C_j(0V)\{1-V_j/V_{bi}\}^{-n}$$

where $V_j$ is the junction voltage, $C_j(V_j)$ is the resulting capacitance per unit area, $C_j(0V)$ is the capacitance at $V_j=0V$, $V_{bi}$ is the junction built-in potential, and n represents the power dependence of capacitance on $V_j$. The larger the reverse bias across the junction, the smaller the capacitance.

Figure 1:
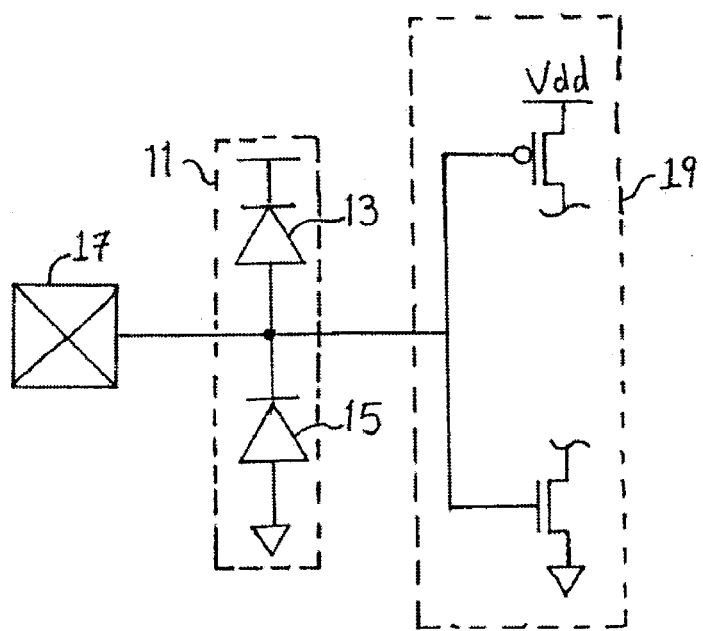
FIG. 1 shows a basic ESD circuit structure in between an input pad and internal circuitry.
Figure 2:
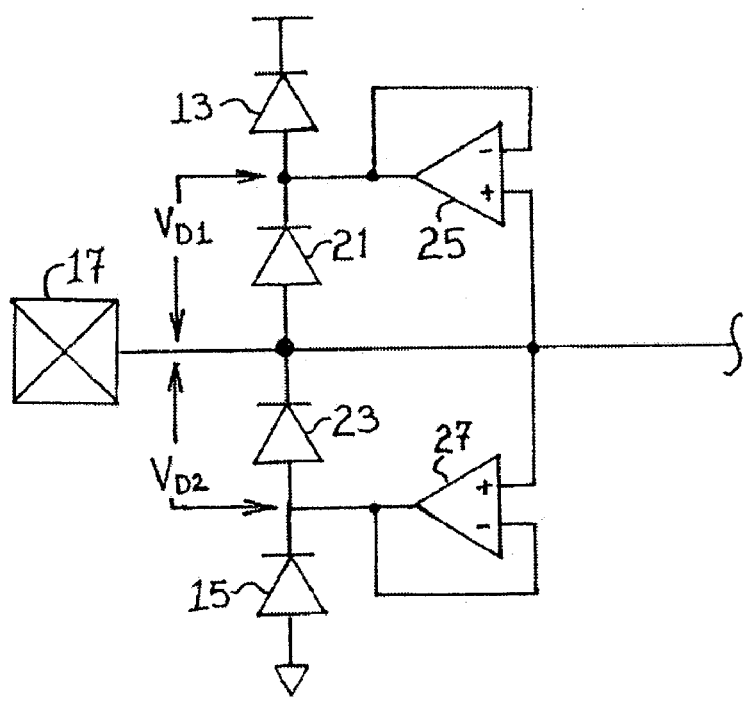
FIG. 2 is a prior art ESD circuit for reducing ESD capacitance.
Figure 3:
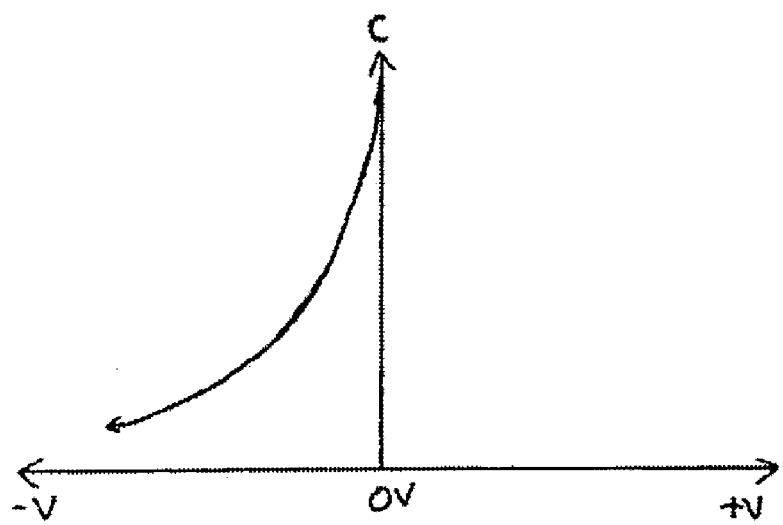
FIG. 3 is a pictorial representation of the relationship between a diode's capacitance and an applied reverse biased junction voltage.

A pictorial representation of this relationship is shown in FIG. 3. The capacitance is plotted along the y-axis, identified by the label letter "C", and the applied voltage bias is plotted along the x-axis, identified by the label letters "–V" and "+V". As shown, the diode's junction capacitance decreases as the magnitude of the applied reverse bias across the junction is increased. That is, the junction capacitance decreases as one move leftward along the X-axis.

It has been found that maintaining the load capacitance due to an ESD protection circuit, i.e. the maximum junction capacitance, to no greater than 1.0 pF, can mitigate signal degradation previously attributed to excessive ESD capacitive loading. It is to be understood that this 1.0 pf measure is a currently preferred value, and that other maximum capacitive values may be selected as a design choice without detracting from the present invention.

Figure 4:
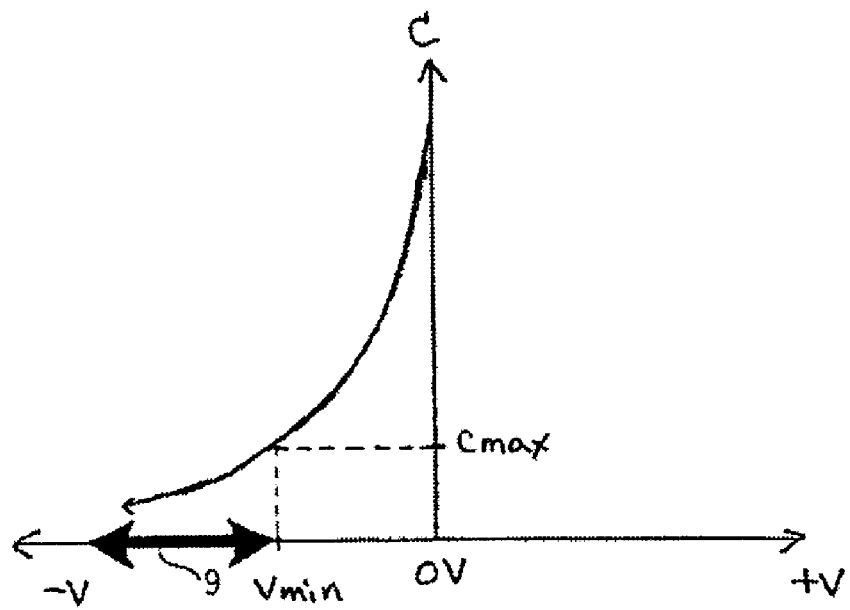
FIG. 4 is a pictorial representation of a preferred reverse biased junction voltage range for use with the present invention.

FIG. 4 illustrates that the maximum junction capacitance on a diode may be kept below a predetermined value, Cmax, by applying a reverse junction bias not greater than a value, Vmin. Stated differently, the junction capacitance of a diode will remain no greater than Cmax along as an applied reverse junction bias has a magnitude no smaller than Vmin, as indicated by double-headed arrow 9 along the X-axis. It is to be understood that the term "magnitude", as used herein, refers to the absolute value of a number as is typically understood in mathematics.

Figure 5:
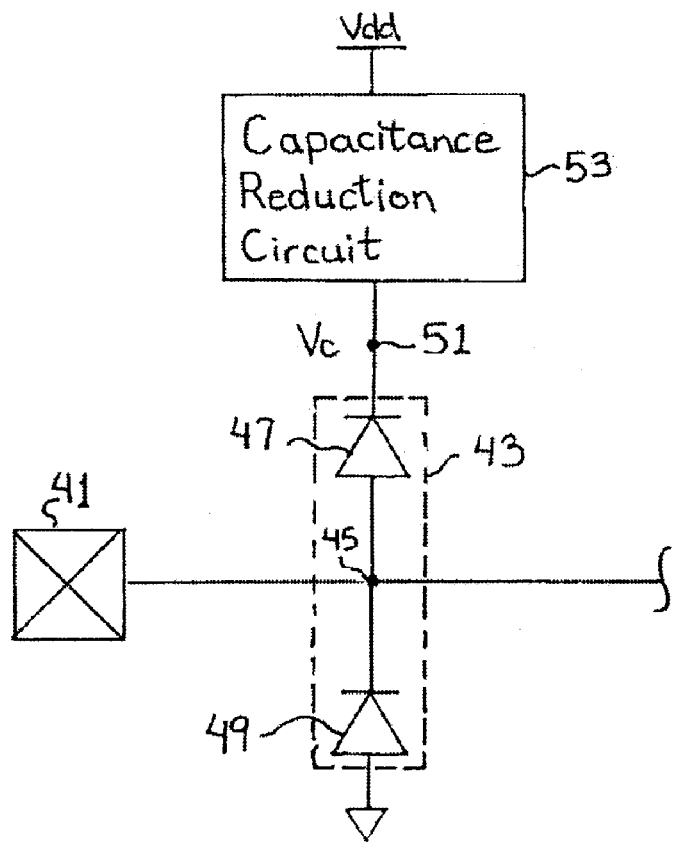
FIG. 5 is first embodiment of the present invention for applying reverse bias voltage across an electrostatic-protection diode.

With reference to FIG. 5, a first embodiment of the present invention is applied to one branch of a double-diode, electrostatic-discharge protection structure 43. A signal pad 41 is coupled to double-diode structure 43 at signal node 45. As it would be understood, if signal pad 41 is an input pad, then signal node 45 would be coupled to an input buffer, not shown. Similarly, if signal pad 41 is an input/output pad, then signal node would be coupled to an input/output buffer.

Double-diode structure 43 consists of a first electrostatic-discharge-protection diode 47 and a second electrostatic-discharge-protection diode 49. Second electrostatic-discharge-protection 49 has its cathode coupled to signal node 45 and has its anode coupled to ground. When a voltage potential at signal pad 41 drops below ground by at least the forward voltage drop of diode 49, which may include its threshold voltage and any body effect voltage variations, diode 49 will turn on and couple signal pad 41 to ground.

First electrostatic-discharge-protection 47 has its anode coupled to signal node 45 and has its cathode coupled to junction node 51. As explained above, it is desirable that when the voltage potential at signal pad 41 rises a predetermined amount above Vdd, first electrostatic-discharge-protection diode 47 should turn on and signal pad 41 should be coupled to Vdd through diode 47.

In the present first embodiment, a capacitance reduction circuit 53 is coupled between junction node 51 and Vdd. Thus first electrostatic-discharge-protection 47 and capacitance reduction circuit 53 are coupled in series between signal node 45 and Vdd. Capacitance reduction circuit 53 applies a compensation voltage Vc to the cathode of diode 47 at node 51. Compensation voltage Vc may be a constant voltage potential or may have some oscillating quality, but it suffices that Vc remain of greater magnitude than the predetermined minimum Vmin described above with reference to FIG. 4.

Under normal operation, the potential at signal pad 41 will fluctuate by the application of logic signals, which may be defined by voltage potential values ranging between the power rails, Vdd and ground. Thus, the potential at signal node 45 would be restricted to not more than Vdd and not less than ground during normal operation. If capacitance reduction circuit 53 were not used and the cathode of diode 47 were connected directly to Vdd, then diode 47 would experience a reverse bias due to Vdd when the potential at signal node 45 were to receive a low potential, but when the potential at signal node 45 were to rise up to Vdd due to a logic signal transition, diode 47 would experience no reverse bias and its relative junction capacitance would thus grow.

The present first embodiment assures that the junction capacitance of diode 47 remains below a predefined maximum Cmax by assuring that during normal operation the magnitude of an applied reversed bias across diode 47 remains greater than the predefined minimum Vmin. Since the potential of signal node 45 may rise up to Vdd during normal operation, compensation voltage Vc is necessarily made greater than Vdd to assure that an applied reverse bias across diode 47 always remains greater than the predefined minimum Vmin irrespective of logic, and thereby voltage, fluctuations at signal node 45.

Therefore during normal operation, capacitance reduction circuit 53 outputs a compensation voltage Vc of greater magnitude than the positive power rail, Vdd. Compensation voltage Vc maintains a reverse bias across diode 47, and thereby reduces the capacitance on signal pad 41, as long as signal pad 41 does not experience an upward spiking electrostatic voltage discharge.

An upward voltage spike at signal node pad 41 causes the potential at signal 45 to also spike upward. As the potential at signal node 45 rises above Vc by one forward voltage drop of diode 47, diode 47 turns on and couples signal node 45 to junction 51. In order to provide electrostatic protection, capacitance reduction circuit 53 responds to unexpected voltage fluctuations at node 51 resulting from electrostatic discharge by ceasing to output compensation voltage Vc and immediately routing junction node 51 to positive power rail Vdd. In this manner, capacitance reduction circuit 53 protects itself from damage from any voltage spikes on signal node 45 while continuing to provide electrostatic protection to the overall circuit, or device.

It is to be noted, however, that while in the prior art, an electrostatic-protection-diode, such as diode 47, would determine the turn-on point for electrostatic protection, in the present invention the turn-on point is determined by capacitance reduction circuit 53 by virtue of voltage compensation voltage Vc. That is, in the prior art discussed above, the turn-on point, i.e. the voltage value at which an upward voltage spike would trigger the electrostatic protection mechanism of an ESD circuit, or device, was determined to be one forward voltage drop of diode 13 above Vdd. In the present invention, however, the turn-on point is determined by Vc since the electrostatic protection mechanism of the circuit won't turn on until the potential at signal node 45 is one forward diode voltage drop above Vc. Thus by adjusting Vc, one may adjust the turn-on point for ESD protection.

Figure 6:
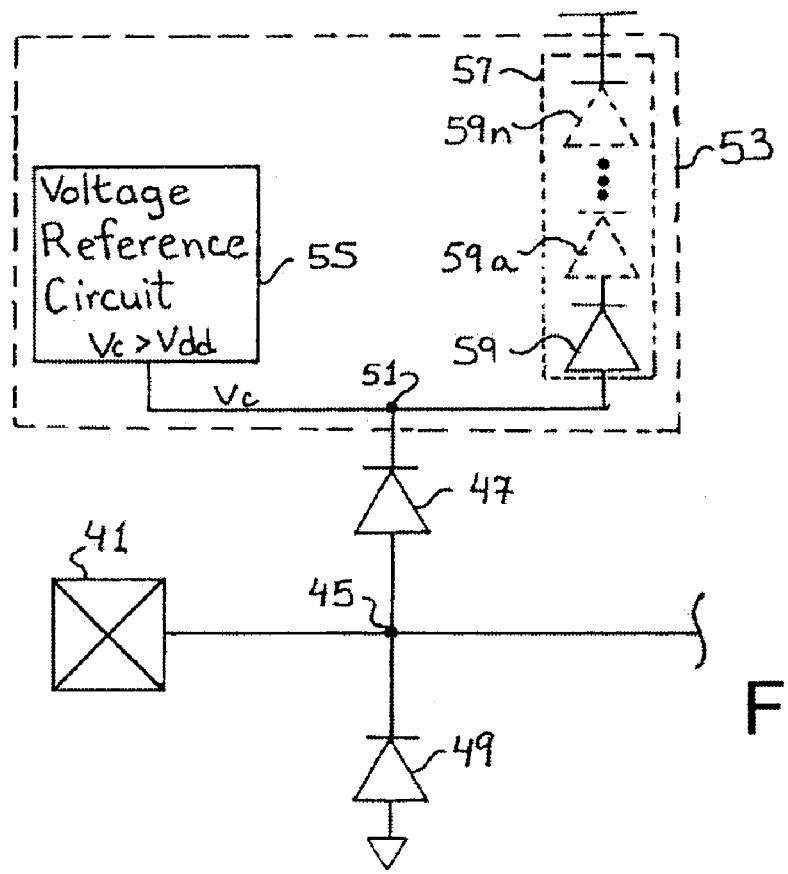
FIG. 6 is a first implementation of the embodiment of FIG. 5.

With reference to FIG. 6, a first implementation of capacitance reduction circuit 53 is shown to include a voltage reference circuit 55 for outputting compensation voltage Vc, and a voltage clamping device 57 illustratively implemented as a shunting diode 59. Preferably during normal operation (i.e. during non-ESD operation), Vc has a value of about half a volt above Vdd such that Vc is below the activation voltage of clamping device 57. Also preferably, diode 47 is made smaller than shunting diode 59 to further reduce the intrinsic capacitance of diode 47. In this manner, the parasitic loading capacitance of the present ESD structure can be decreased while not degrading ESD protection levels.

Alternatively, if Vc is selected to be above the activation voltage of clamping device 57, then clamping device 57 would place a maximum value on the magnitude of compensating voltage Vc. That is, if Vc were to rise above a predetermined value, i.e. the activation voltage of clamping device 57, clamping device 57 would activate and prevent Vc from rising any further. In the present example, clamping device 57 is preferably implemented as a single shunting diode 59 and thus Vc would be prevented from rising more than one forward voltage drop of shunting diode 59 (i.e. about 0.75V to 1.5V) above Vcc. It is to be understood that the activation voltage of clamping device 57 may be increased by optionally placing additional shunting diodes 59a-59n in series with shunting diode 59. In this manner, the maximum magnitude of Vc may be determined by the sum of all the series connected shunting diodes 59 and 59a-59n, which together would comprise clamping device 57.

However, since in the presently preferred embodiment clamping device 57 is implemented using single shunting diode 59 and since the maximum value of Vc is preferably set below the forward activation voltage of shunting diode 59, the turn-on point at which an upward voltage spike at signal node 45 would trigger the electrostatic protection mechanism of the present ESD structure is set to Vdd plus the sum of the forward voltage drops of shunting diode 59 and electrostatic-protection diode 47.

Figure 7:
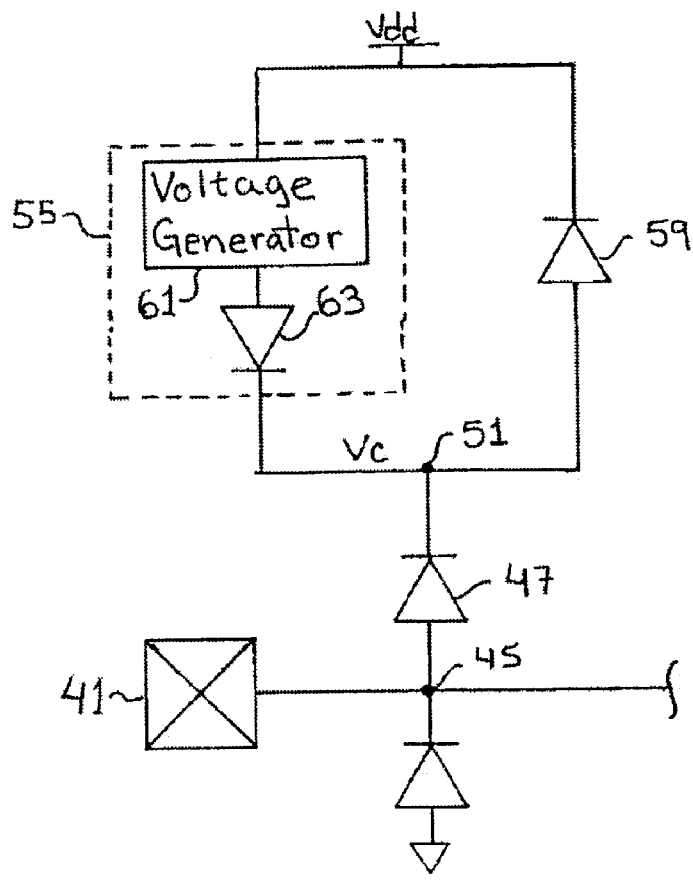
FIG. 7 is a second implementation of the embodiment of FIG. 5.

As explained above, capacitance reduction circuit 53 decouples voltage reference circuit 55 from junction node 51 when the electrostatic protection mechanism of the present circuit turns on in order to protect voltage reference circuit 55 from any damaging high voltages while clamping circuit 57 is routing the electrostatic discharge to Vdd. In FIG. 7, voltage reference circuit 55 preferably includes a voltage generator 61 and a current steering diode 63 connected in series between Vdd and junction node 51. Under normal operating conditions, the output from voltage generator 61 is conveyed by current steering 53 to junction node 51 as voltage compensation signal Vc. It is to be understood that due to the need to overcome the forward-voltage drop of current steering diode 63, the output of voltage generator 61 is necessarily higher than both Vc and Vdd. Thus, the cathode of current steering diode 63 is connected to the cathode of electrostatic-protection diode 47 and connected to the anode of shunting diode 59. Therefore, under normal operating conditions when shunting diode 59 is inactive, voltage is transferred from voltage generator 61 through current steering diode 63 to junction node 51 to maintain a continual reverse bias across diode 47 irrespective of the normal operating voltage fluctuations at signal node 45. However, when the voltage at signal node 45 rises above the turn-on point for activating electrostatic protection, voltage is transferred from signal node 45 through diode 47 to junction node 51. Since this electrostatic discharge voltage spike has a voltage value higher than any voltage output from voltage generator 61, current steering diode 63 is itself reversed biased and cut-off. Thus, voltage generator 61 is effectively decoupled from junction node 51 by the cutting-off action of current steering diode 63. At the same time, shunting diode 59 is forward biased causing it to turn on and thereby shunt junction node 51, and by extension signal node 45, to power rail Vdd.

Figure 8:
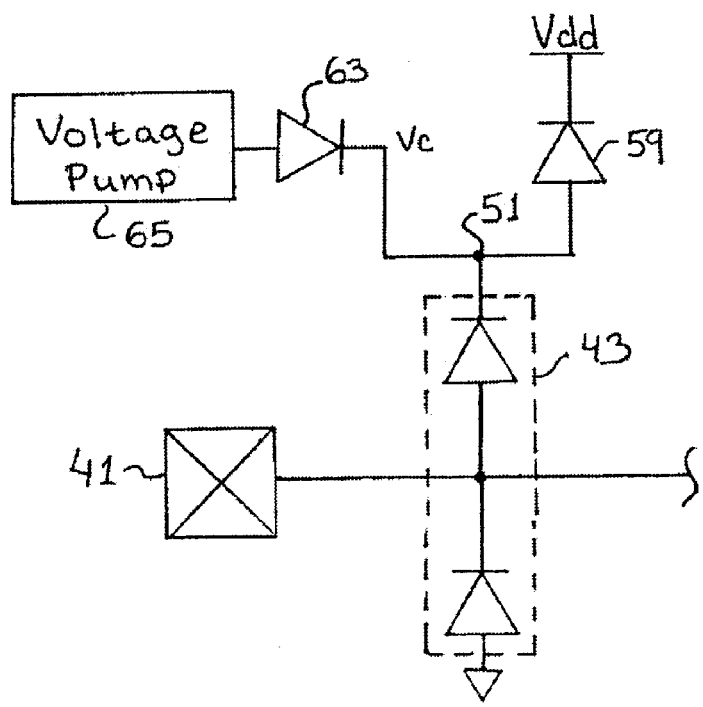
FIG. 8 is a third implementation of the embodiment of FIG. 5.

As explained above, the output of voltage generator 61 is greater than Vdd. An exemplary implementation for achieving this is shown in FIG. 8, where the voltage generator 61 of FIG. 7 is implemented as a voltage pump 65 with its output connected to current steering diode 63. Voltage pump 65 maintains an output voltage higher than Vdd during normal operation and is decoupled from junction node 51 when the electrostatic protection mechanism is activated. All other functions of the circuit of FIG. 8 are substantially similar to those described above with reference to FIGS. 6 and 7.

Figure 9:
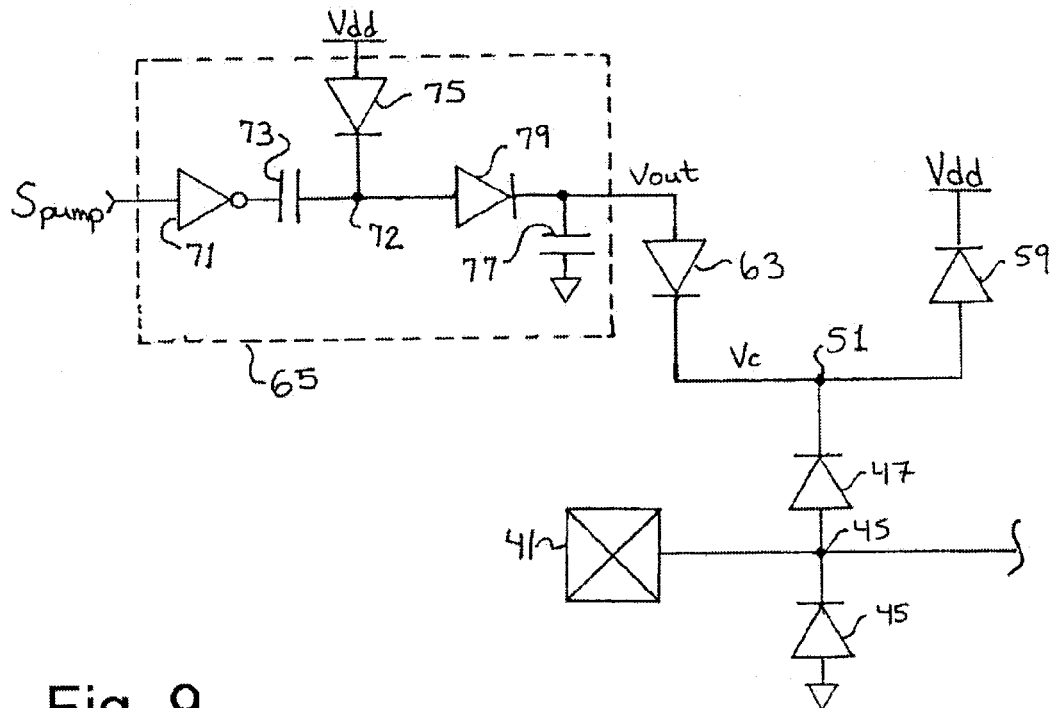
FIG. 9 is a circuit-level implementation of the structure of FIG. 8.

With reference to FIG. 9, a first implementation of voltage pump 65 is shown. A signal Spump, oscillating between Vdd and ground, is applied to the input of an inverter 71, whose output is coupled to node 72 via a first capacitor 73. Vdd is coupled to node 72 through first pump diode 75, and node 72 is coupled to one end of second capacitor 77 through second pump diode 79. Second capacitor 77 functions as a load capacitor to hold the voltage output from voltage pump 65, and thus has its other end grounded.

To understand the operation of voltage pump 65, it is helpful to first look at the ideal operation of a voltage pump. We begin by assuming that the output of inverter 71 is low, and the voltage at node 72 is Vdd−Vfwd$_{75}$ (i.e. Vdd less the forward voltage drop across diode 75). At this point the voltage at the output of diode 79 would be the voltage at node 72, i.e. V$_{72}$, less the forward voltage drop across diode 79, Vfwd$_{79}$. Stated differently, the voltage at node 77 is Vdd−Vfwd$_{75}$−Vfwd$_{79}$. When the output of inverter 72 goes high, the potential at node 72 is shifted upward since the potential across capacitor C1 cannot changed instantaneously. Assuming that the output high of inverter 71 is Vdd, then when the output of inverter 71 goes high, the voltage at node 72 ideally jumps to Vdd+Vdd−Vfwd$_{75}$. The jump in voltage at node 72 causes diode 79 to turn on and charge second capacitor 77. If one assumes that the capacitance of capacitor 73 is much greater than that of capacitor 77 and that the frequency of oscillating signal Spump allows the capacitors 73 and 77 to fully charge or discharge before changing states, then the potential across capacitor 77 will rise to Vdd+Vdd−Vfwd$_{75}$−Vfwd$_{79}$. Assuming that the forward voltage drop of diodes 75 and 79 are the same (i.e., Vfwd$_{75}$=Vfwd$_{79}$=Vfwd), then second capacitor 77 charges up to 2(Vdd−Vfwd).

It is to be understood that in many practical application capacitors 73 and 77 would be of similar capacitance, and the output of the voltage pump 65 would have some DC loading effect. Therefore in practice, the output of voltage pump 65 may not rise up to 2(Vdd−Vfwd) so quickly, and may instead require a little time to pump its output voltage up, i.e. it may require a "start-up" time.

Figure 10:
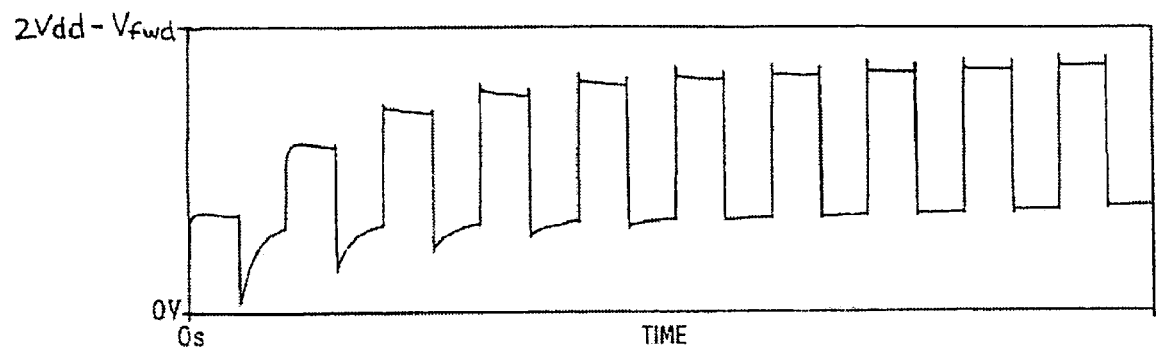
FIG. 10 is a pictorial representation of an exemplary voltage pump-up sequence at node 72 of FIG. 9.
Figure 11:
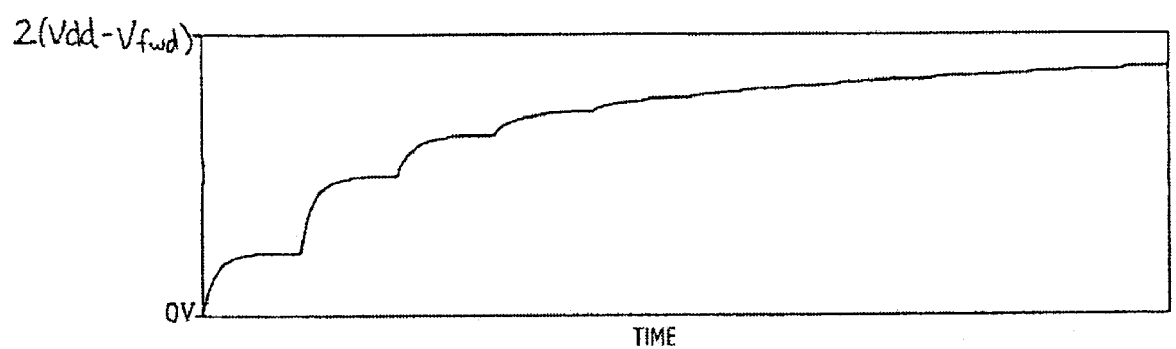
FIG. 11 is a pictorial representation of an exemplary voltage pump-up sequence at the output of the voltage pump of FIG. 9.

An example of typical start-up voltage fluctuations at node 72 and at the output of voltage pump 65 are shown in FIG. 10 and 11, respectfully. FIG. 10 shows how the voltage at node 72 experiences a rising DC offset with applied oscillating signal Spump over time. FIG. 11 illustrates that the growing potential at node 72 results in a discretely ramping voltage at the output (across capacitor 77) up to the final output voltage of 2(Vdd−Vfwd). As shown, output voltage Vout, may experience some ripple, but this ripple is of no consequence as long as the magnitude of compensation voltage Vc at node 51 is maintained greater then a predefined minimum Vmin, as was explained above in reference to FIG. 4.

Returning to FIG. 9, it is evident that the protective action of current steering diode 63 may be provided by pump diode 79 since both could effectively decouple voltage pump 65 from junction node 51 if the potential at junction 51 were to rise too high due to an electrostatic discharge. Therefore in FIG. 12, current steering diode 63 is incorporated into the circuit structure of voltage pump 65 and replaces pump diode 79 of FIG. 9. All other operations of the circuit of FIG. 12 are similar to those of FIG. 9, and are explained above.

Figure 12:
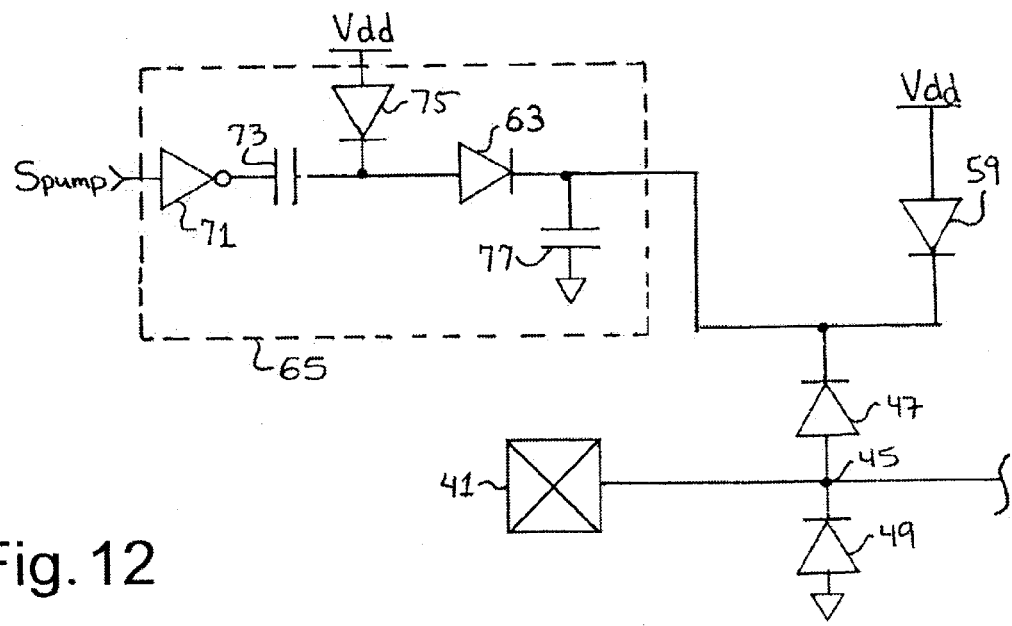
FIG. 12 is an alternate circuit-level implementation of the structure of FIG. 8.

With reference to FIG. 13, a simplified MOS implementation of voltage pump 65 of FIG. 12 is shown. Diodes 75 and 63 are implemented as diode-connected NMOS transistors. In the present case, the threshold voltage and body effects, if any, of the transistors act as the forward voltage drop of a diode. Alternatively as shown in FIG. 14, diode 75 may also be implemented by using an NMOS transistor 74 coupled between Vdd and node 72, and having its control gate coupled to signal Spump. It is to be understood that capacitors 73 and 77 may also be implemented using MOS transistors, as it is known in the art, by using the control gate of an MOS transistor as one electrode of a capacitor and tying together the source and drain electrodes of the transistor to form the second electrode of the capacitor.

Figure 15:
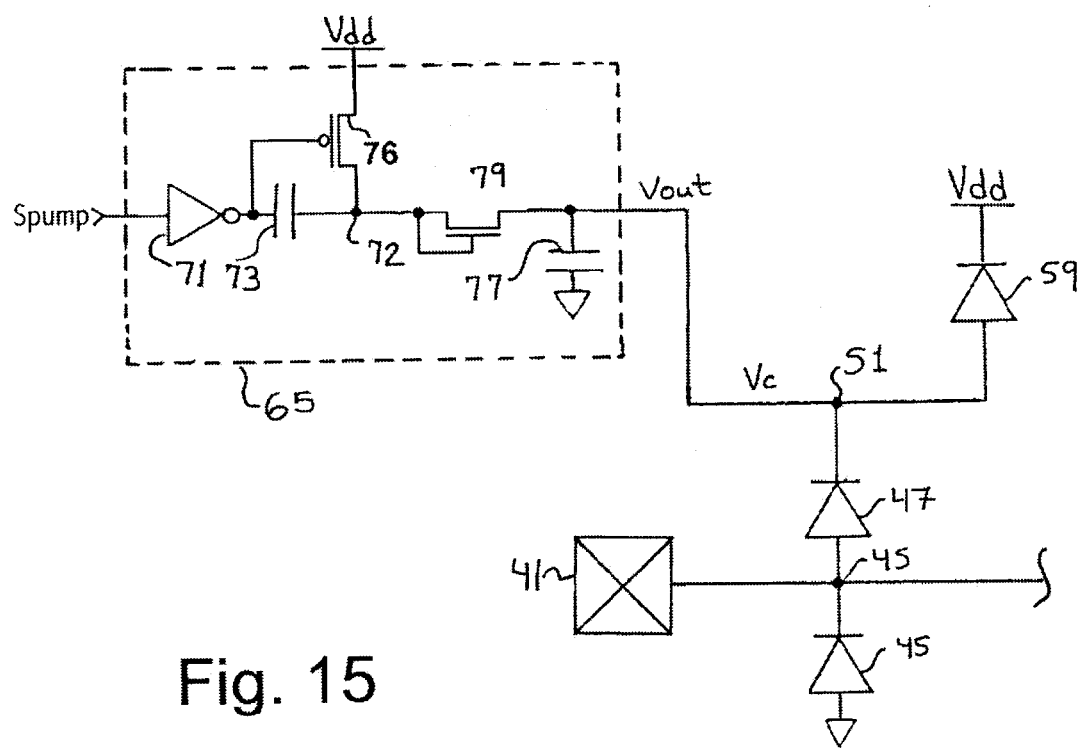
FIG. 15 is an alternate MOS implementation for increasing the output voltage of the voltage pump of FIG. 12.

Different configurations can raise or lower the output value Vout of voltage pump 65. For example in FIG. 15, a PMOS transistor 76 is used in place of diode 75. The output of inverter 71 is coupled to the control gate of PMOS transistors 76 such that transistor 76 is ON when Spump is high, and transistor 76 is OFF when the Spump is low, and the voltage pump thus achieves a similar behavior as before. Since PMOS transistor 76 does not experiences any Vfwd voltage drop, PMOS transistor 76 can transfer the full value of Vdd onto node 72 during the charging stage and thus the target output voltage Vout is increased.

However, in the present example of FIG. 13 using a two-diode configuration for voltage pump 65, the output voltage Vout of voltage pump 65 is reduced by the two forward voltage drops of diodes 75 and 63 (or 79) to 2(Vdd−Vfwd). Nonetheless, the voltage at node 51 is limited by shunting diode 59 to one forward voltage drop above Vdd. Requiring shunting diode 59 to always be ON in order to limit Vc may result in an unacceptable increase in power consumption. Therefore, it may be desirable to reduce the target output voltage Vout of voltage pump 65 to a value above Vdd, but less than Vdd plus the forward voltage drop of diode 59.

Figure 16:
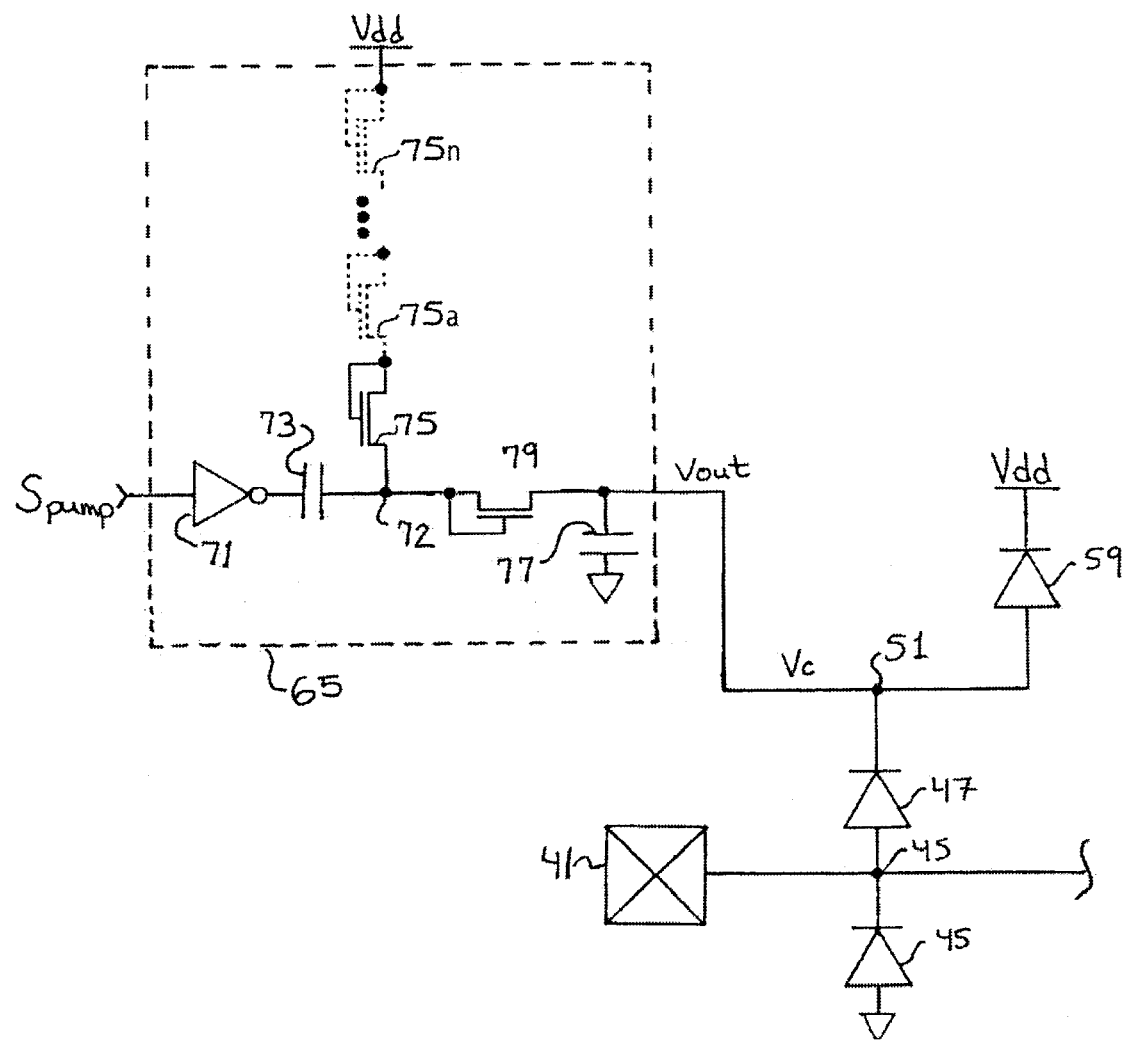
FIG. 16 is an alternate implementation for reducing the output of a voltage pump of FIG. 12 by using additional diodes.

Several methods for reducing the target output voltage, Vout, of voltage pump 65 may be used. For example with reference to FIG. 16, additional diode 75a to 75n may be inserted between diode 75 and Vdd. This would reduce the magnitude of the voltage transferred from Vdd to node 72 and thus reduce the final value of Vout.

Figure 17:
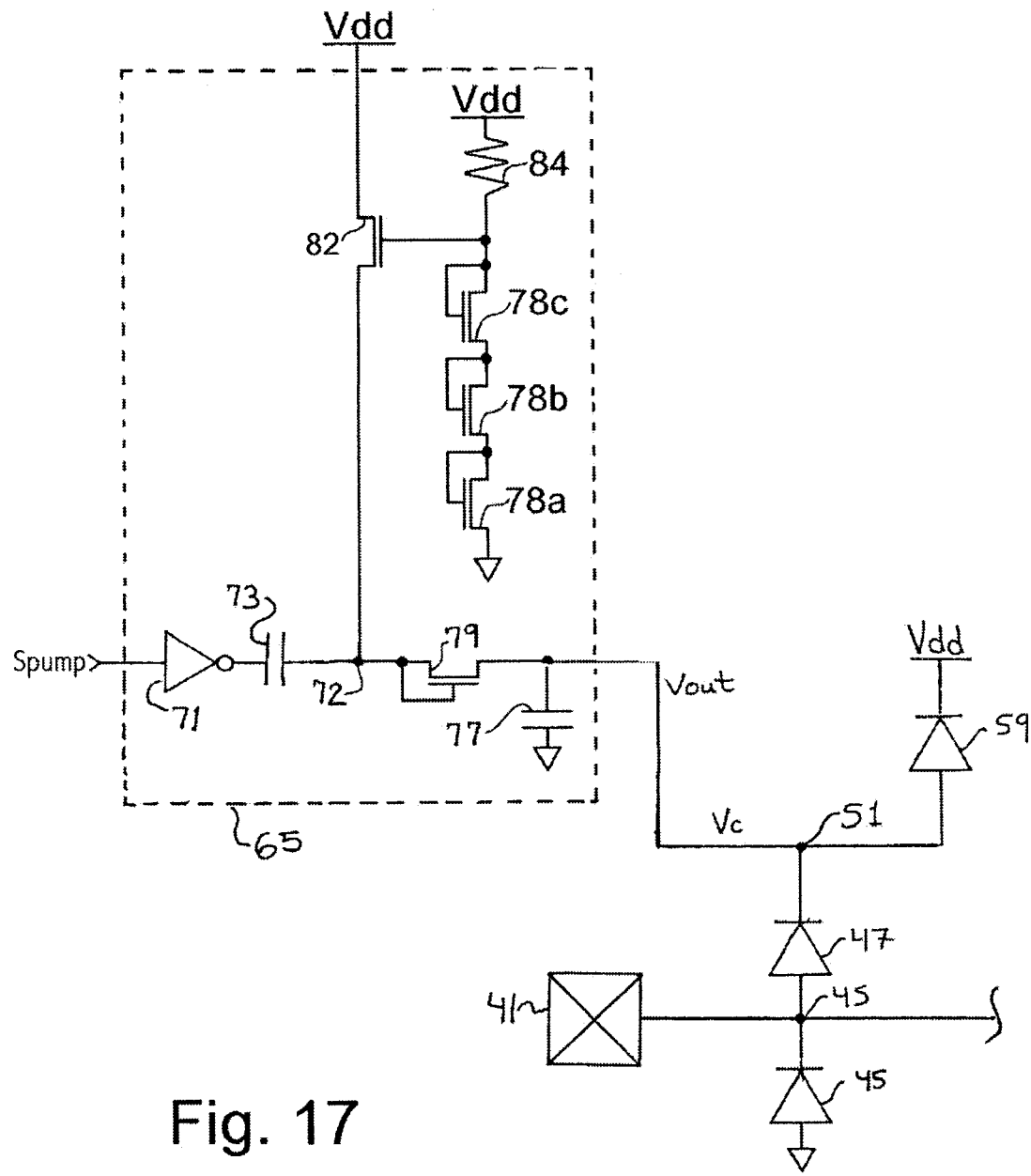
FIG. 17 is a second alternate implementation for reducing the output of a voltage pump of FIG. 12 by using controlled voltage at the gate of transistor 82.

Alternatively as shown in FIG. 17, diode 75 may be replaced by a transistor controlled to maintain the voltage at node 51 to at most Vdd plus one Vfwd. In the present example, diode 75 is replaced by an NMOS transistor 82 with its control gate maintained at 3 Vfwd's to achieve the desired output at node 51. By having 3 Vfwd at the control gate of transistor 82, node 72 would only charge to 2 Vfwd, and the pump would only rise to Vdd+2 Vfwd, thus giving the desired value of Vdd+Vfwd at node 51. The voltage at the control gate of NMOS transistor 82 is maintained by three small diode-connected devices 78a-78c connected in series with a large value resistor 84 between Vdd and ground.

Figure 18:
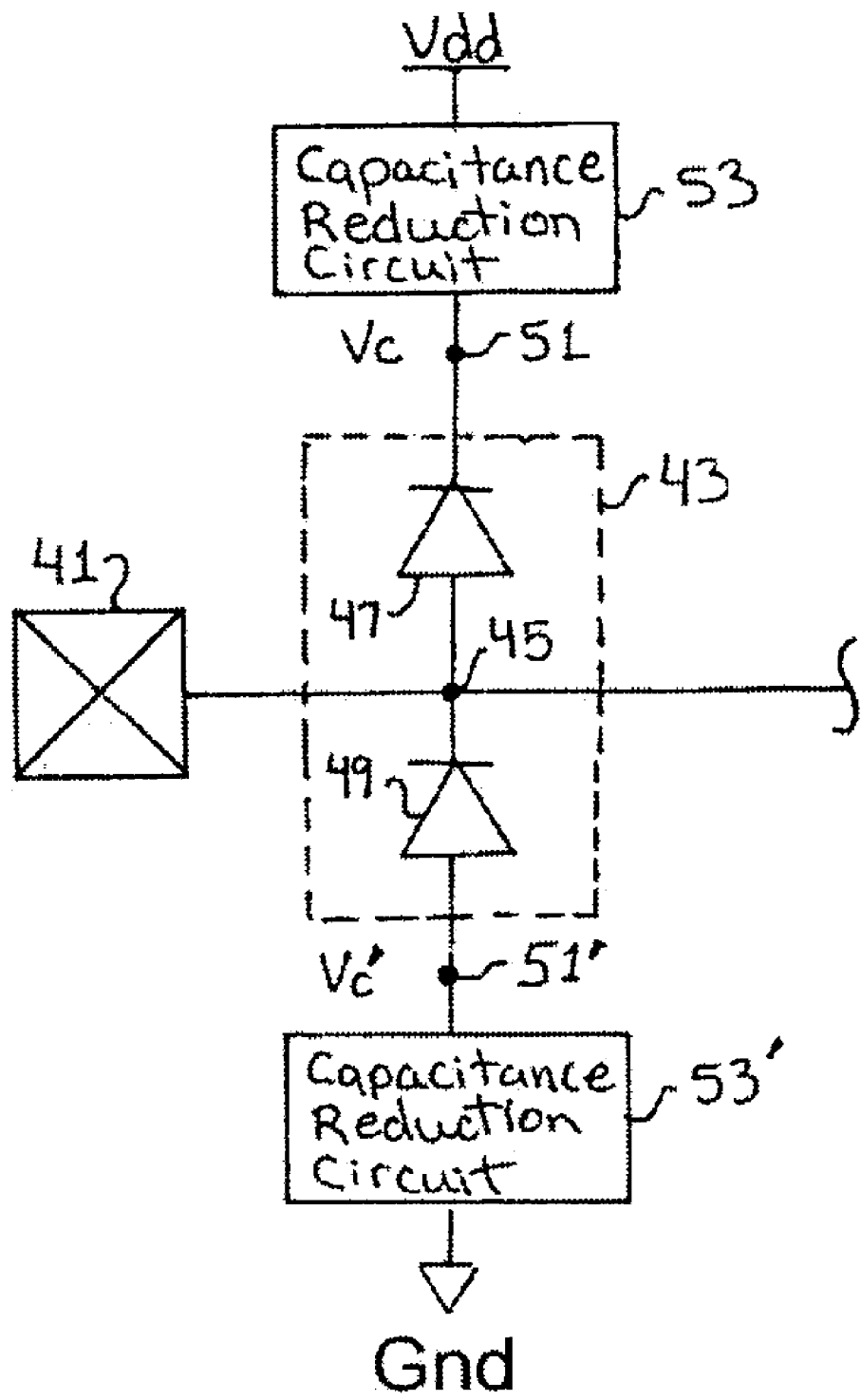
FIG. 18 is second embodiment of the present invention for applying a reverse bias voltage across the electrostatic-protection diodes of both power rails.

With reference to FIG. 18, an alternate embodiment of the present invention adds capacitance compensation to the ESD protection structure of both power rails, Vdd and Gnd. As before, a first capacitance reduction circuit 53 is inserted between electrostatic-discharge diode 47 and power rail Vdd. First capacitance reduction circuit 53 applies a first compensation voltage Vc to first junction node 51. As before, the magnitude of Vc is greater than Vdd and thus the voltage potential of Vc is higher than that of Vdd.

In the present case, a second capacitance reduction circuit 53' is inserted between second electrostatic-discharge diode 49 and second power rail Gnd. Second capacitance reduction circuit 53' applies a second compensation voltage Vc' to second junction node 51'. Also as before, the magnitude of Vc' must be greater than Gnd to in order assure that a reverse bias potential is maintained across diode 49 irrespective of voltage fluctuations at signal node 45 resulting from normal logic signal transitions at pad 41. Thus, the voltage potential of Vc' is lower than Gnd. In this manner when the voltage potential at signal node 45 is 0V, representing a logic low, signal node 45 will remain at a higher potential than second junction node 51' and diode 49 will thus remain reversed biased. In this manner, the node capacitance seen from signal pad 41 is effectively lowered irrespective of the logic stat at signal node 45.

It is to be understood that second capacitance reduction circuit 53' may have a similar structure as that of first capacitance reduction circuit 53 with the appropriate modifications for outputting a negative potential Vc' in place of a positive potential Vc.

FIGS. 18-24 show a similar circuit structure as those of FIGS. 5-9, 12, and 17 with the addition of a second capacitance reduction circuit for providing capacitance compensation to second power rail Gnd. All elements in the FIGS. 18-24 having a similar function as those of FIGS. 5-9, 12, and 17, but connected to provide an inverse, i.e. negative, operation are identified by similar reference characters with the addition of a prime symbol ['], and are explained above. It is to be understood that the methods for controlling a voltage pump, as well as the methods for reducing the target output voltage of a voltage pump, described above in reference to FIGS. 13-16 are likewise applicable to the voltage pumps for outputting positive and negative voltages shown below with reference to FIGS. 21-24 with only minor modifications believed to be within the scope of those versed in the art.

Figure 19:
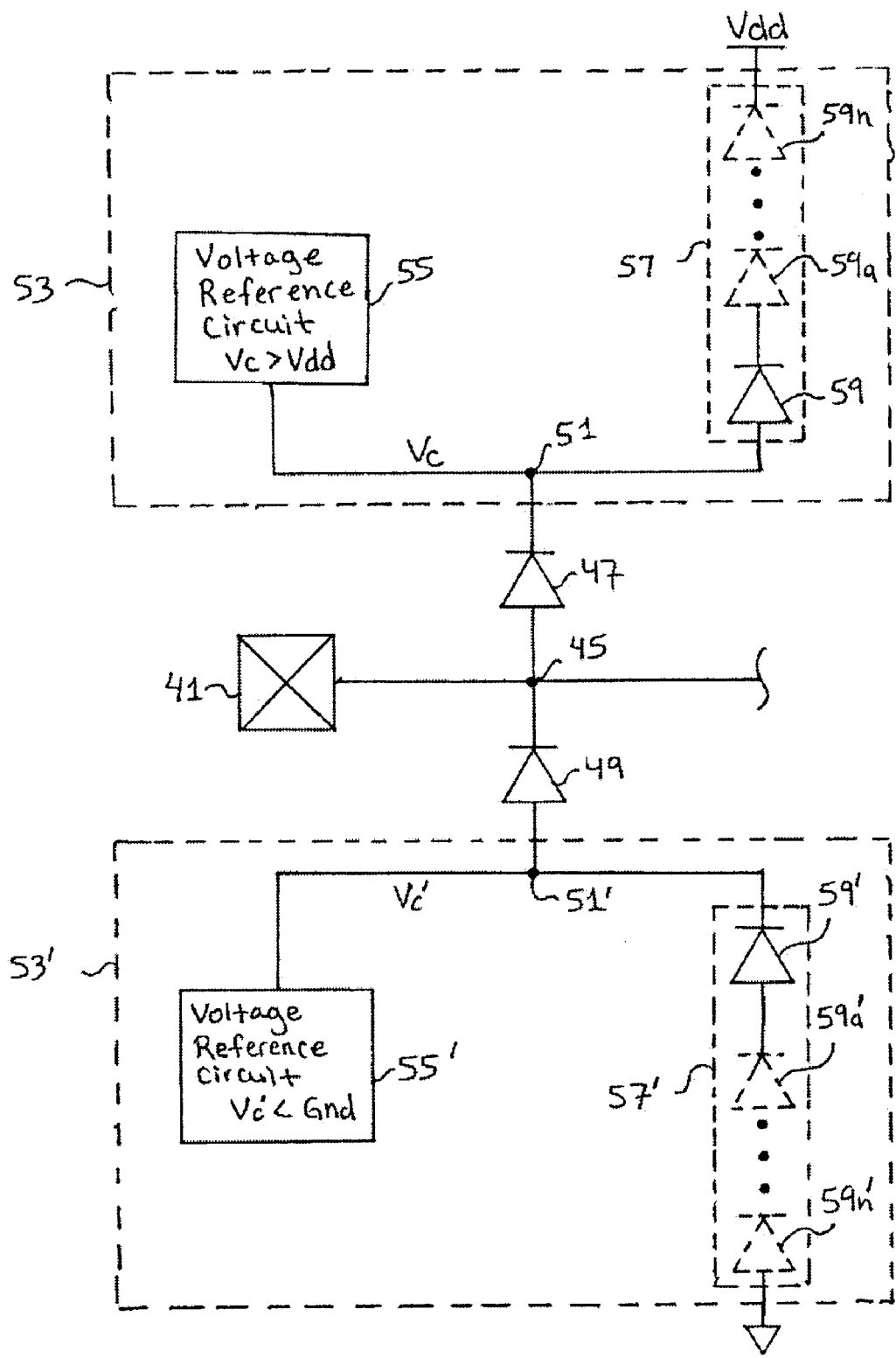
FIG. 19 is a first implementation of the embodiment of FIG. 18.

For example in FIG. 19, second capacitance reduction circuit 53' consists of second voltage reference circuit 55' for providing second compensation voltage Vc'. Similarly, second clamping device 57' is illustratively shown to comprise one 59', and/or multiple 59a' to 59n', shunting diodes.

Figure 20:
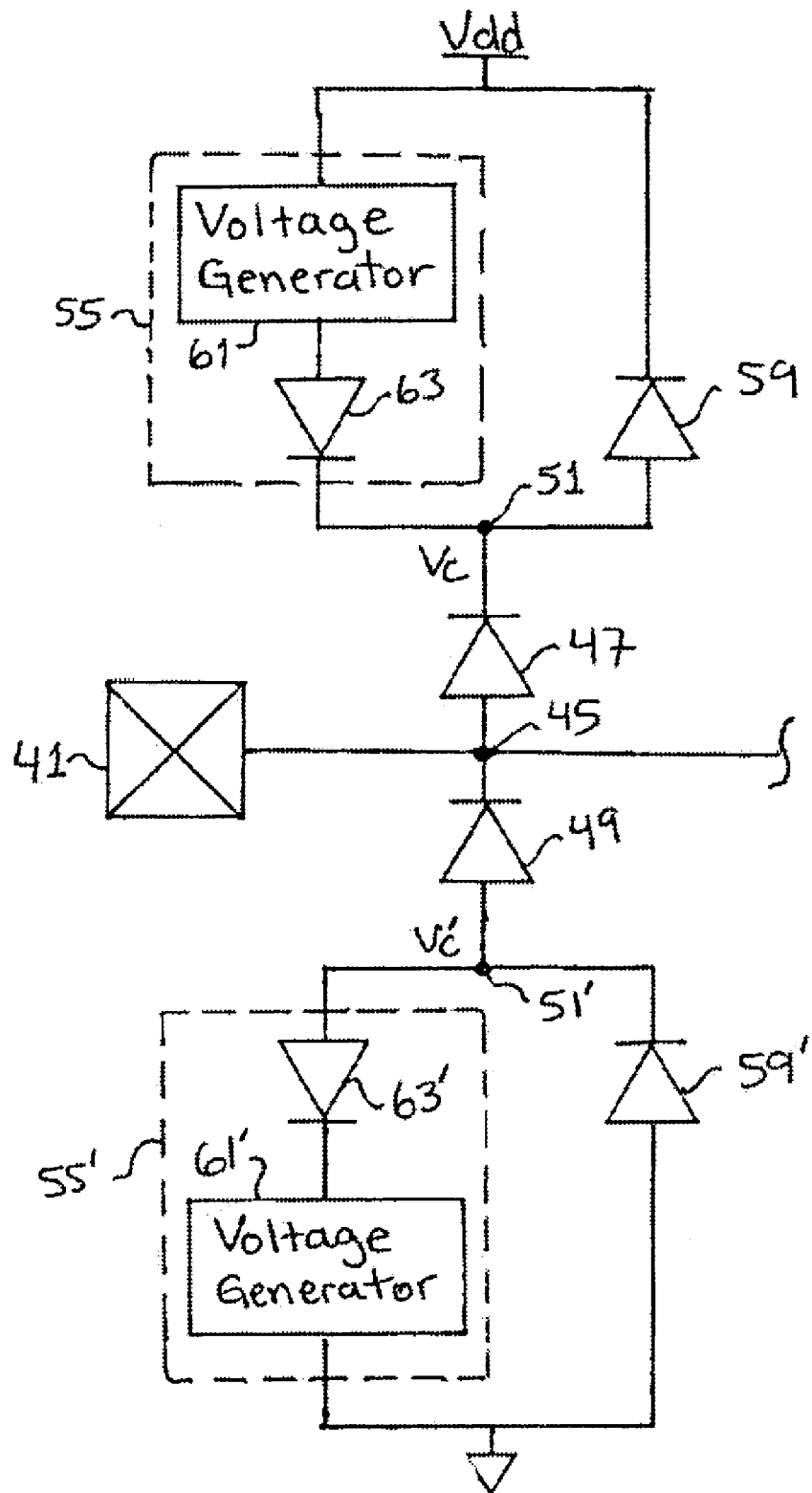
FIG. 20 is a second implementation of the embodiment of FIG. 18.

In FIG. 20, second voltage reference circuit 55' is shown to comprise second voltage generator 61' and second current steering diode 63'.

Figure 21:
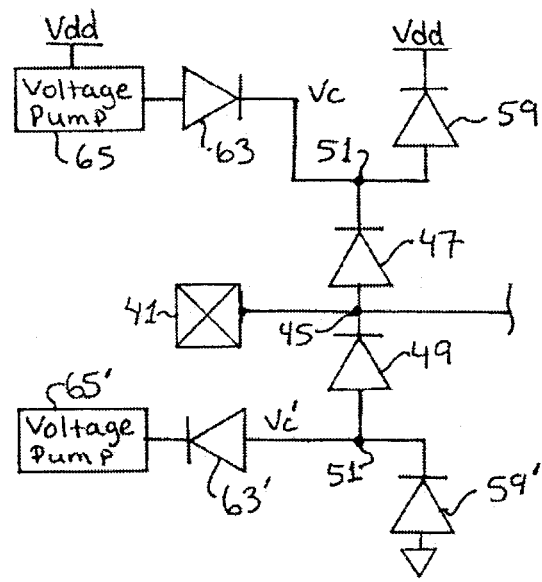
FIG. 21 is a third implementation of the embodiment of FIG. 18.
Figure 22:
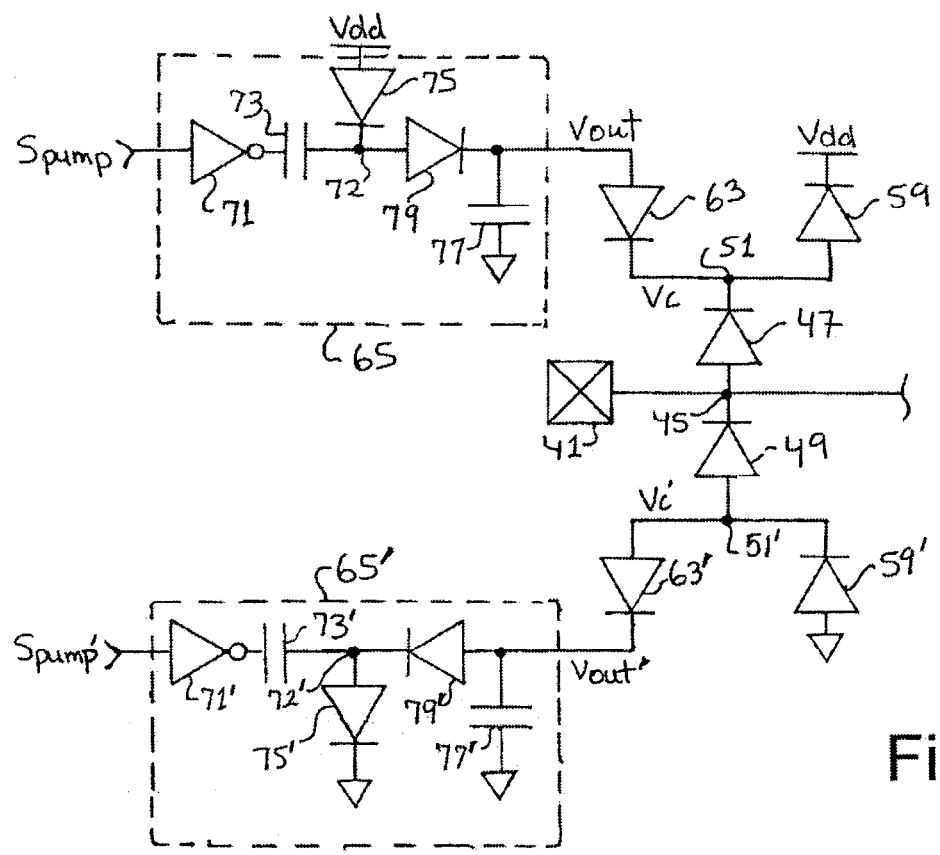
FIG. 22 is a circuit-level implementation of the structure of FIG. 21.

In FIG. 21, second voltage generator 61' of FIG. 20 is replaced by a second voltage pump 65'. In FIG. 22, second voltage pump 65' is shown to consist of second inverter 71', pump diodes 75' and 79', and capacitors 73' and 77'. It is to be understood that the connections of inverter 71', pump diodes 75' and 79', and capacitors 73' and 77' are the inverse of that of voltage pump 65 in order to provide a negatively pumped output voltage Vout'.

Figure 23:
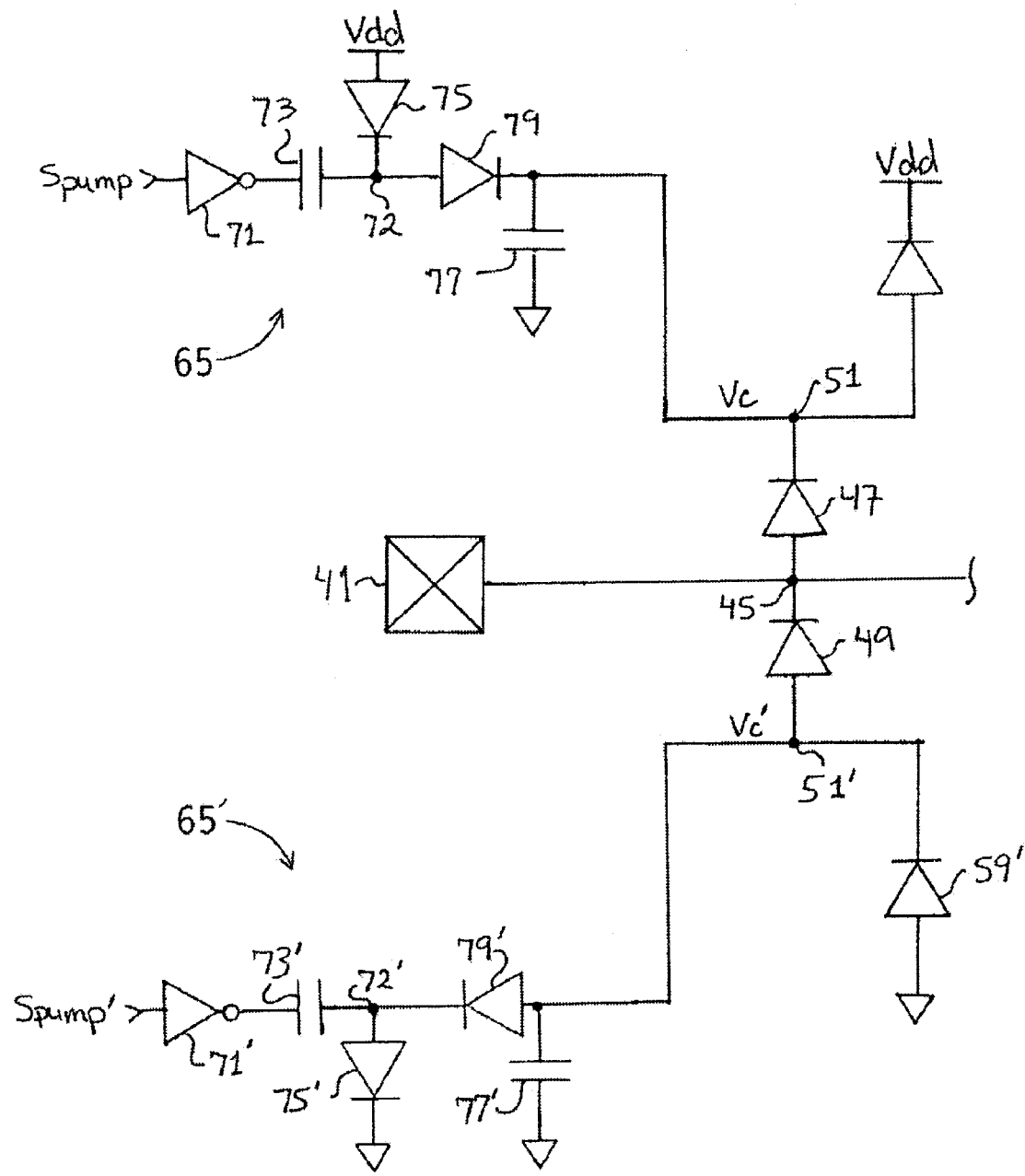
FIG. 23 is an alternate circuit-level implementation of the structure of FIG. 21.
Figure 24:
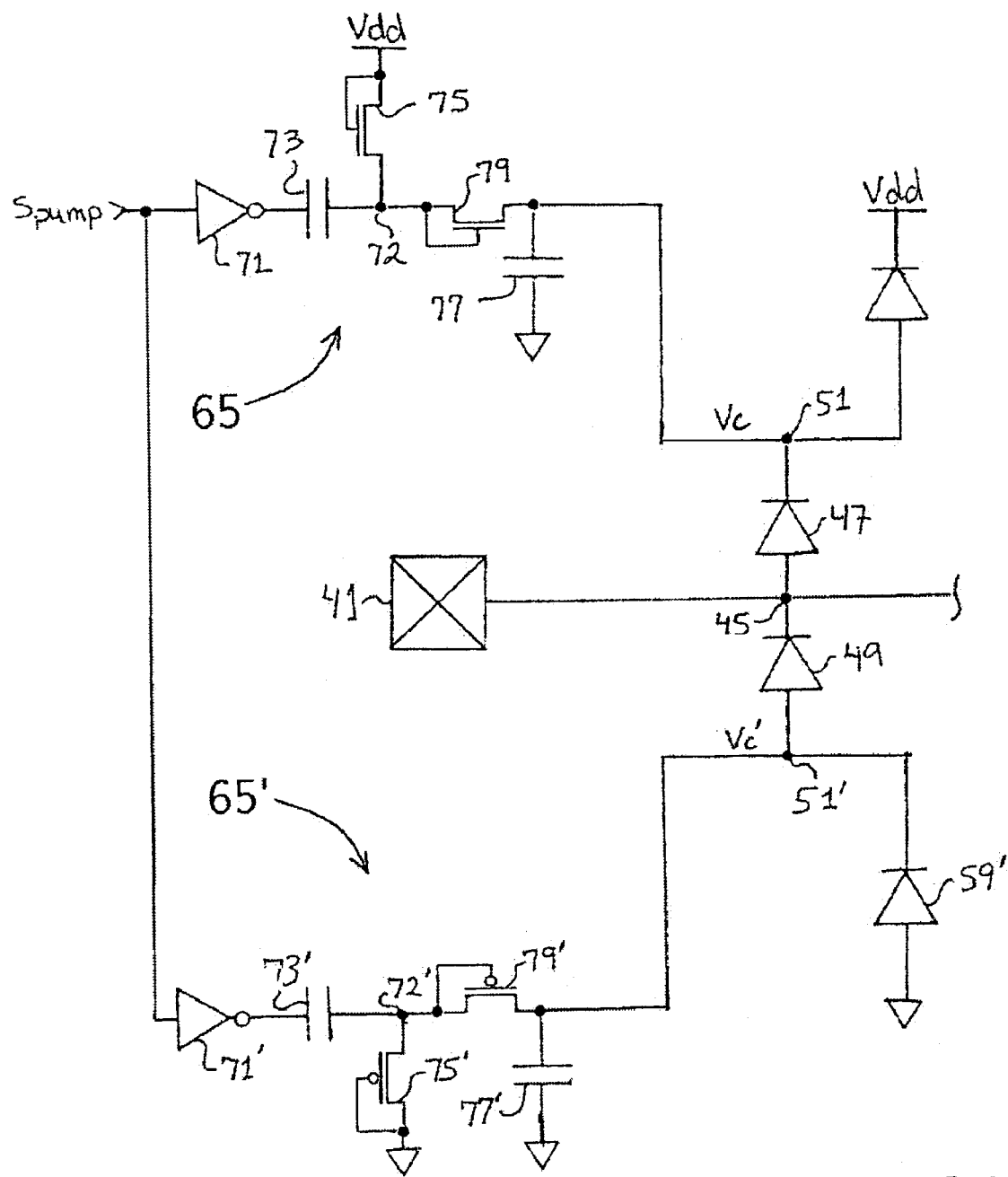
FIG. 24 is a second representation of the circuit of FIG. 23.

In FIG. 23, second steering diode 63' is incorporated into the structure of second voltage pump 65'. Lastly in FIG. 26, pump diodes 75 and 79 are illustratively implemented using two diode-connected NMOS transistors, and diodes 75' and 79' are illustratively implemented using two diode-connected PMOS MOS transistors. FIG. 24 also illustrates that the same signal, Spump, may be used to drive both voltage pumps 65 and 65'.

It is to be understood that the ESD protection structure of the present invention may be incorporated into an integrated circuit (IC), such as constructed on a common substrate. Alternatively the present ESD protection structure may be incorporated into an electronic device having multiple IC dies or chips.

What is claimed:

1. An electrostatic discharge circuit comprising:
   a first power rail;
   a signal node;
   an electrostatic-discharge-protection diode having a first end coupled to said signal node, and having a second end opposite said first end and coupled to a junction node;
   a capacitance reduction circuit coupled to said junction node, said capacitance reduction circuit being effective for providing a compensation voltage at said junction node when the magnitude of the voltage potential at said signal node is not greater than a predetermined value, said compensation voltage being of greater magnitude than said first power rail, said capacitance reduction circuit being further effective for coupling said junction node to said first power rail when the magnitude of the voltage potential at said signal node is greater than said predetermined value;
   wherein said capacitance reduction circuit includes a voltage pump for providing said compensation voltage to said junction node, said voltage pump having:
      an inverter responsive to a pumping signal;
      a first capacitive device coupled between the output of said inverter and a charge collection node;
      an MOS device coupled between said first power rail and said charge collection node;
      a second capacitive device for holding an output charge; and
      a pump diode for coupling said charge collection node to said second capacitive device;
   wherein said MOS device is a PMOS device, and the control gate of said PMOS device is responsive to logic transitions of said pumping signal.

2. The electrostatic discharge circuit of claim 1, wherein said signal node is limited to nominal signal voltages of magnitude not exceeding said first power rail.

3. The electrostatic discharge circuit of claim 1, further having an ESD detection circuit coupling said junction node to said first power rail, wherein said ESD detection circuit detects an ESD event upon the magnitude of the voltage potential at said signal node becoming not less than said predetermined value.

4. The electrostatic discharge circuit of claim 3, wherein said ESD detection circuit is a shunting diode having a characteristic forward activation voltage, said shunting diode being coupled between said junction node and said first power rail, wherein an onset of said ESD event is detected when a magnitude of a potential voltage at said junction node reaches a value equal to a magnitude sum of said first power rail and a forward activation voltage of said shunting diode.

5. The electrostatic discharge circuit of claim 1, wherein said compensation voltage is maintained applied to said junction node until detection of an ESD event.

6. The electrostatic discharge circuit of claim 1, wherein said capacitance reduction circuit includes:
a cutoff circuit for decoupling said voltage pump from said junction node when said capacitance reduction circuit couples said junction node to said first power rail.

7. The electrostatic discharge circuit of claim 6, wherein said cutoff circuit includes a current steering diode having an anode coupled to an output of said voltage generating circuit and having a cathode coupled to said junction node.

8. The electrostatic discharge circuit of claim 1, wherein said capacitance reduction circuit includes:
a shunting diode coupled between said junction node and said first power rail;
wherein a magnitude of said compensation voltage is below a value needed to activate said shunting diode.

9. The electrostatic discharge circuit of claim 8, wherein said voltage pump and said shunting diode are connected in parallel to each other.

10. The electrostatic discharge circuit of claim 8, wherein said shunting diode is one of multiple shunting diodes within a clamping device.

11. The electrostatic discharge circuit of claim 8, wherein:
said signal node is limited to nominal signal voltages of magnitude not exceeding said first power rail;
said shunting diode comprises an ESD detection circuit that detects an onset of an ESD event when a magnitude of a potential voltage at said junction node reaches a value equal to a magnitude sum of said first power rail and a forward activation voltage of said shunting diode.

12. The electrostatic discharge circuit of claim 8, wherein:
said first end of said electrostatic-discharge-protection diode is a first anode coupled to said signal node and said second end of said electrostatic-discharge-protection diode is a first cathode coupled to said junction node; and
said shunting diode has a second anode coupled to said junction node and has a second cathode coupled to said first power rail.

13. The electrostatic discharge circuit of claim 12, wherein said voltage pump includes a current steering diode at an output stage of said voltage pump, said current steering diode being effective for permitting the flow of current from said voltage pump to said junction node, and for impeding the flow of current from said signal node to said voltage pump.

14. The electrostatic discharge circuit of claim 13, wherein said current steering diode has a third cathode connected to said first cathode and has a third anode coupled to said voltage pump.

15. The electrostatic discharge circuit of claim 13, wherein said current steering diode is an integral part of the charge pumping circuitry of said voltage pump.

16. The electrostatic discharge circuit of claim 15, further having a capacitive device coupled between said junction node and a second power rail.

17. The electrostatic discharge circuit of claim 16 wherein said capacitive device is one of a physical capacitor and an intrinsic capacitance.

18. The electrostatic discharge circuit of claim 1, wherein said first power rail is a positive voltage power rail and said compensation voltage has a positive voltage potential higher than the potential of said first power rail, whereby the magnitude of said compensation voltage is greater than the magnitude of the voltage potential of said positive voltage power rail.

19. The electrostatic discharge circuit of claim 1, wherein said first power rail is a non-positive voltage power rail and said compensation voltage has a negative voltage potential lower than the potential of said first power rail, whereby the magnitude of said compensation voltage is greater than the magnitude of the voltage potential of said non-positive voltage power rail.

20. The electrostatic discharge circuit of claim 1 further comprising:
a second power rail;
a second electrostatic-discharge-protection diode coupled between said signal node and a second junction node;
a second capacitance reduction circuit coupled to said second junction node, said second capacitance reduction circuit being effective for providing a second compensation voltage at said second junction node when the magnitude of the voltage potential at said signal node is not greater than a second predetermined value, said second compensation voltage being of greater magnitude than said second power rail, said second capacitance reduction circuit being further effective for coupling said junction node to said second power rail when the magnitude of the voltage potential at said signal node is greater than said predetermined value.

21. The electrostatic discharge circuit of claim 20, wherein said second predetermined value is substantially equal to said first predetermined value.

22. The electrostatic discharge circuit of claim 1, wherein said signal node is an input pad.

23. The electrostatic discharge circuit of claim 1, wherein said signal node is an input/output pad.

24. An integrated circuit incorporating said electrostatic discharge circuit of claim 1.

25. An electronic device incorporating said electrostatic discharge circuit of claim 1.

26. The electrostatic discharge circuit of claim 1, wherein said PMOS device is coupled to receive the logical complement of said pumping signal.

27. The electrostatic discharge circuit of claim 1, further having a plurality of diodes coupled in series between said first power rail and said charge collection node.

28. An electrostatic discharge circuit comprising:
a first power rail;
a signal node;
an electrostatic-discharge-protection diode having a first end coupled to said signal node;

a capacitance reduction circuit coupled in series with said electrostatic-discharge-protection diode and effective for producing a compensation voltage at a junction node connected to a second end of said electrostatic-discharge-protection diode opposite said first end, said compensation voltage being of greater magnitude than the magnitude of said first power rail;

wherein said capacitance reduction circuit includes:
a voltage generation circuit for producing said compensation voltage at said junction node; and
a shunting diode coupled between said junction node and said first power rail;

wherein said voltage generation circuit is a voltage pump having:
an inverter responsive to a pumping signal;
a first capacitive device coupled between the output of said inverter and a charge collection node;
an MOS device coupled between said first power rail and said charge collection node;
a second capacitive device for holding an output charge; and
a pump diode for coupling said charge collection node to said second capacitive device;

wherein said MOS device is a PMOS device, and the control gate of said PMOS device is responsive to logic transitions of said pumping signal.

29. The electrostatic discharge circuit of claim 28, wherein said voltage generation circuit and said shunting diode are connected in parallel to each other.

30. The electrostatic discharge circuit of claim 28, wherein said PMOS device is coupled to receive the logical complement of said pumping signal.

31. The electrostatic discharge circuit of claim 28, further having a plurality of diodes coupled in series between said first power rail and said charge collection node.

32. The electrostatic discharge circuit of claim 28, wherein said capacitance reduction circuit includes a cutoff circuit for decoupling said capacitance reduction circuit from said electrostatic-discharge-protection diode when the voltage magnitude at said signal node increases above a predefined value greater than said compensation voltage produced by said capacitance reduction circuit.

33. The electrostatic discharge circuit of claim 28, wherein said capacitance reduction circuit includes a unidirectional circuit, and said voltage generation circuit is in series with said unidirectional circuit for permitting a current flow from said voltage generation circuit to said junction node and for impeding a current flow from said junction node to said voltage generation circuit.

34. The electrostatic discharge circuit of claim 33;
wherein said unidirectional circuit permits current flow from said voltage generation circuit to said junction node when the output voltage from said voltage generation circuit is greater than the voltage potential at said junction node; and
wherein said unidirectional circuit impedes current flow from said junction node to said voltage generation circuit when the voltage potential at said junction node has a predetermined voltage magnitude greater than the output voltage from said voltage generation circuit.

35. The electrostatic discharge circuit of claim 34;
wherein said first end of said electrostatic-discharge-protection diode is a first anode coupled to said signal node and said second end of said electrostatic-discharge-protection diode is a first cathode coupled to said junction node; and
wherein said unidirectional circuit is a current-steering diode having a second cathode connected to said first cathode, and having a second anode coupled to said voltage generation circuit.

36. The electrostatic discharge circuit of claim 35, wherein said capacitance reduction circuit further includes a shunting diode connected between said junction node and said a first power rail.

37. The electrostatic discharge circuit of claim 36, wherein said shunting diode has a third anode connected to said first cathode and has a third cathode connected to said first power rail.

38. The electrostatic discharge circuit of claim 36, wherein said shunting diode is connected in parallel to said series connected voltage generation circuit and unidirectional circuit.

39. The electrostatic discharge circuit of claim 28, wherein said shunting diode is one of multiple shunting diodes within a clamping device.

40. The electrostatic discharge circuit of claim 28, wherein said unidirectional circuit is a current-steering diode acting as an output stage of said voltage pump.

41. The electrostatic discharge circuit of claim 40, further having a capacitive device coupled between said junction node and a second power rail.

42. The electrostatic discharge circuit of claim 41 wherein said capacitive device is one of a physical capacitor and an intrinsic capacitance.

43. The electrostatic discharge circuit of claim 28, wherein said first power rail is a positive voltage power rail and said compensation voltage has a positive voltage potential higher than the potential of said first power rail, whereby the magnitude of said compensation voltage is greater than the magnitude of the voltage potential of said positive voltage power rail.

44. The electrostatic discharge circuit of claim 28, wherein said first power rail is a non-positive voltage power rail and said compensation voltage has a negative voltage potential lower than the potential of said first power rail, whereby the magnitude of said compensation voltage is greater than the magnitude of the voltage potential of said non-positive voltage power rail.

45. The electrostatic discharge circuit of claim 28, wherein said signal node is an input pad.

46. The electrostatic discharge circuit of claim 28, wherein said signal node is an input/output pad.

47. An integrated circuit incorporating said electrostatic discharge circuit of claim 28.

48. An electronic device incorporating said electrostatic discharge circuit of claim 28.

* * * * *